(12) United States Patent
Chang et al.

(10) Patent No.: US 7,768,321 B2
(45) Date of Patent: Aug. 3, 2010

(54) SINGLE-ENDED SENSE AMPLIFIER USING DYNAMIC REFERENCE VOLTAGE AND OPERATION METHOD THEREOF

(75) Inventors: Meng Fan Chang, Taichung (TW); Shu Meng Yang, Hualien County (TW); Jiunn Way Miaw, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 12/191,057

(22) Filed: Aug. 13, 2008

(65) Prior Publication Data

US 2010/0039173 A1 Feb. 18, 2010

(51) Int. Cl.
G11C 7/00 (2006.01)
G01R 19/00 (2006.01)
H03F 3/45 (2006.01)
(52) U.S. Cl. .............................. 327/56; 327/51; 327/67
(58) Field of Classification Search .................. 327/51, 327/56, 67
See application file for complete search history.

(56) References Cited

U.S. PATENT DOCUMENTS

| 5,825,212 A | 10/1998 | Priebe |
| 5,949,256 A | 9/1999 | Zhang et al. |
| 6,297,670 B1 | 10/2001 | Chao et al. |
| 6,549,049 B1 * | 4/2003 | Hinterscher .................. 327/206 |
| 6,707,321 B2 * | 3/2004 | Cho et al. ...................... 327/51 |

* cited by examiner

*Primary Examiner*—Lincoln Donovan
*Assistant Examiner*—John W Poos
(74) *Attorney, Agent, or Firm*—WPAT, P.C.; Anthony King

(57) ABSTRACT

A single-ended differential sense amplifier comprises a dynamic reference voltage generation circuit and a differential sense amplifier circuit. Input data with an input data line voltage is provided to the differential sense amplifier circuit. The input data line voltage also feeds back to the dynamic reference voltage generation circuit, which then generates a dynamic reference voltage based on the input data line voltage. The differential sense amplifier circuit is coupled to the dynamic reference voltage generation circuit and receives the dynamic reference voltage for determining the input data. The dynamic reference voltage increases and the input data line voltage decreases when reading the input data of a logic state, e.g., logic "0."

10 Claims, 5 Drawing Sheets

SINGLE-ENDED SENSE AMPLIFIER USING DYNAMIC REFERENCE VOLTAGE AND OPERATION METHOD THEREOF

BACKGROUND OF THE INVENTION (A) Field of the Invention

The present invention relates to a single-ended sense amplifier, and more particularly, to a single-ended sense amplifier using a dynamic reference voltage and the operation method thereof.

(B) Description of the Related Art

In a conventional sense amplifier scheme, memory read operation is achieved by comparing input data with a reference voltage to determine the logic state of the input data. Hence, various types of sense amplifiers have been developed accordingly. The single-ended sense amplifier that is coupled to a single bit line is widely used in single-ended type memory designs, and can be attributed to two design styles. Many single-ended type memory designs employ an inverter as a sense amplifier. Such designs mainly use an inverter trip point as a reference voltage level. Consequently, the inverter trip point has to be carefully selected to decrease process-voltage-temperature (PVT) dependence. Reducing process-voltage-temperature (PVT) dependence, however, is not easy. Also, the inverter type sense amplifier is not suitable for large capacity memory designs due to slow bit line discharging time during read "0" operations, resulting in poor speed performance.

Another style of single-ended sense amplifier employs a differential sense amplifier with two inputs, of which one side is coupled to an input data line (bit line) and another side is coupled to a fixed reference voltage that comes from an additional reference voltage or an external voltage supply. This kind of sense amplifier design features a fast sensing speed, and is suitable for large capacity memories with proper reference voltage level adjustment and is robust enough for use in various PVT conditions. However, this sense amplifier occupies a greater area than that of the sense amplifier of an inverter type.

As shown in FIG. 1, the operation of a traditional single-ended differential sense amplifier refers to a fixed reference voltage $V_{REF}$. The voltage of data line $V_{DL}$ decreases if the stored data is logic "0." When $V_{DL}$ falls below $V_{REF}$ and the voltage difference $\Delta V$ between $V_{DL}$ and $V_{REF}$ exceeds a threshold value, e.g., 100 mV, the stored data will be determined as "0" and the sense amplifier will be inverted or activated. However, $V_{DL}$ sometimes drops very slowly, and therefore may take a long time to reach the threshold value. With high-speed performance and large memory capacity requirements, the conventional fixed reference voltage level for sensing operation cannot meet the demand. Therefore, there is a demand to expedite operation efficiency.

SUMMARY OF THE INVENTION

The present invention is directed to providing a single-ended differential amplifier with high operation efficiency and the operation method thereof.

In accordance with the present invention, a single-ended differential sense amplifier comprises a dynamic reference voltage generation circuit and a differential sense amplifier circuit. Input data with an input data line voltage is provided to the differential sense amplifier circuit. The data line voltage also feeds back to the dynamic reference voltage generation circuit, which then generates a dynamic reference voltage based on the input data line voltage. The differential sense amplifier circuit is coupled to the dynamic reference voltage generation circuit and receives the dynamic reference voltage for determining the input data. The dynamic reference voltage increases and the input data line voltage decreases when reading the input data of a logic state, e.g., logic "0."

The operation for the single-ended differential sense amplifier may be described by the steps of: (1) providing input data with an input data line voltage to the single-ended differential sense amplifier; (2) generating a dynamic reference voltage based on the input data line voltage, wherein the dynamic reference voltage increases and the input data line voltage decreases when reading the input data of a logic state, e.g., logic zero; and (3) activating the single-ended differential sense amplifier when the input data line voltage is less than the dynamic reference voltage by a difference that is greater than a threshold value.

In order to make the aforementioned and other objectives, features, and advantages of the present invention more comprehensible, embodiments accompanied with figures are described in detail below.

BRIEF DESCRIPTION OF THE DRAWINGS

The objectives and advantages of the present invention will become apparent upon reading the following description and upon reference to the accompanying drawings in which.

DETAILED DESCRIPTION OF THE INVENTION

Figure 2:
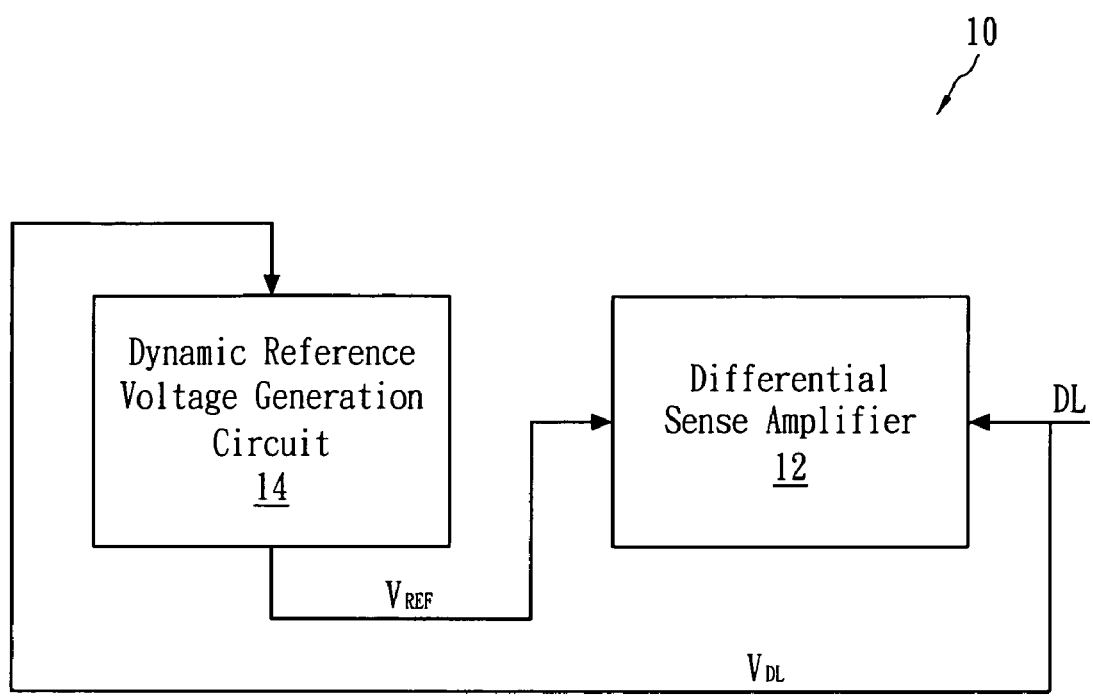
FIG. 2 illustrates a block diagram of the single-ended differential sense amplifier in accordance with the present invention.

FIG. 2 illustrates a block diagram of a single-ended sense amplifier in accordance with the present invention. A single-ended sense amplifier 10 comprises a differential sense amplifier circuit 12 and a dynamic reference voltage generation circuit 14. The differential sense amplifier circuit 12 has two input ends, of which one end is coupled to a data line (bit line) so as to receive input data with a voltage $V_{DL}$ from the data line, and $V_{DL}$ also feeds back to the dynamic reference voltage generation circuit 14. The dynamic reference voltage generation circuit 14 generates a dynamic reference voltage $V_{REF}$ based on $V_{DL}$, and $V_{REF}$ is transmitted to the other end of the differential sense amplifier circuit 12.

Figure 3:
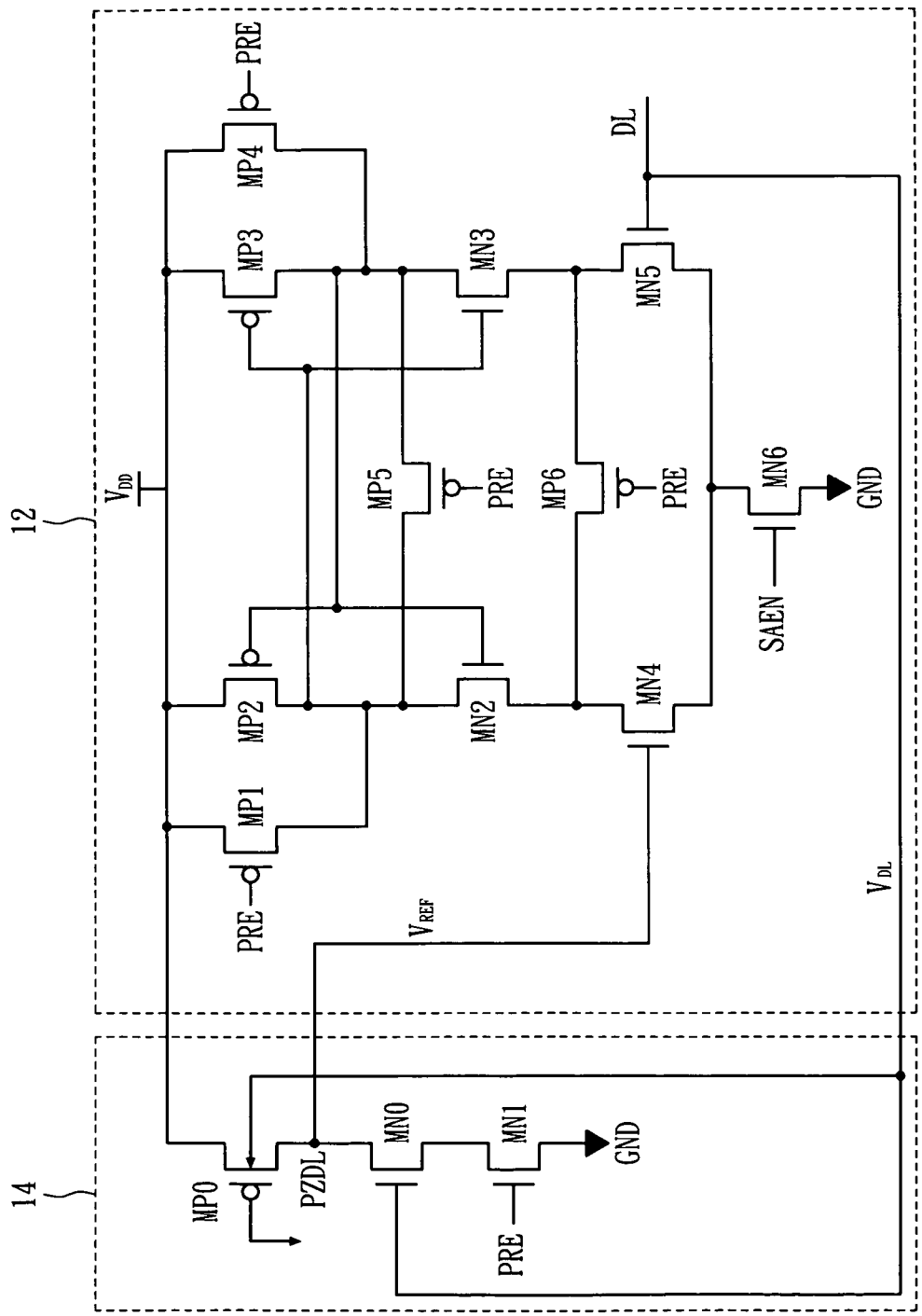
FIG. 3 illustrates a single-ended differential sense amplifier in accordance with an embodiment of the present invention.

In an embodiment, as shown in FIG. 3, the single-ended sense amplifier 10 includes a differential sense amplifier circuit 12 and a feedback type dynamic reference voltage generation circuit 14. The dynamic reference voltage generation circuit 14 includes a PMOS transistor MP0, an NMOS transistor MN0 and an NMOS transistor MN1 that collectively form a cascade down to GND. The differential sense amplifier 12 includes pre-charge PMOS transistors MP1 and MP4, a cross-coupled latch consisting of MP2, MP3, MN2 and MN3, a sensing NMOS pair MN4 and MN5, equalizer PMOS transistors MP5 and MP6, and a sensing enable switch NMOS MN6. The cross-coupled latch consisting of MP2, MP3, MN2 and MN3 is coupled to the pre-charge transistors MP1 and MP4 and the sensing NMOS pair MN4 and MN5.

The dynamic reference voltage generation circuit 14 is an adjustable voltage divider which tracks data line (DL) node voltage level $V_{DL}$ applied to the gate of MN0 and the body of MP0 and generates feedback output voltage, i.e., reference voltage $V_{REF}$, on the PZDL node. More specifically, the PZDL node is placed between MP0 and MN0, and is electrically coupled to the gate electrode of MN4. The differential sense amplifier circuit 12 is of symmetrical device size structure to minimize the mismatch influence on the sensing operation. During the sense amplifier evaluation period, control signals "PRE" and "SAEN" equal $V_{DD}$ and $V_{SS}$ (not shown in FIG. 2), respectively.

If the voltage level on DL node $V_{DL}$ equals $V_{DD}$ (i.e., stored data is logic "1"), MN0 will turn on and a stable and fixed reference voltage $V_{REF}$ will be generated. If the voltage level on DL node $V_{DL}$ decreases gradually from $V_{DD}$ (i.e., stored data is logic "0"), then the gate electrode of the NMOS transistor MN0 and the body electrode of the PMOS transistor MP0 will track $V_{DL}$ and reduce their current due to less Vgs and body effect, respectively, and consequently pull up feedback output voltage $V_{REF}$ on the PZDL node as illustrated in FIG. 4.

Figure 1:
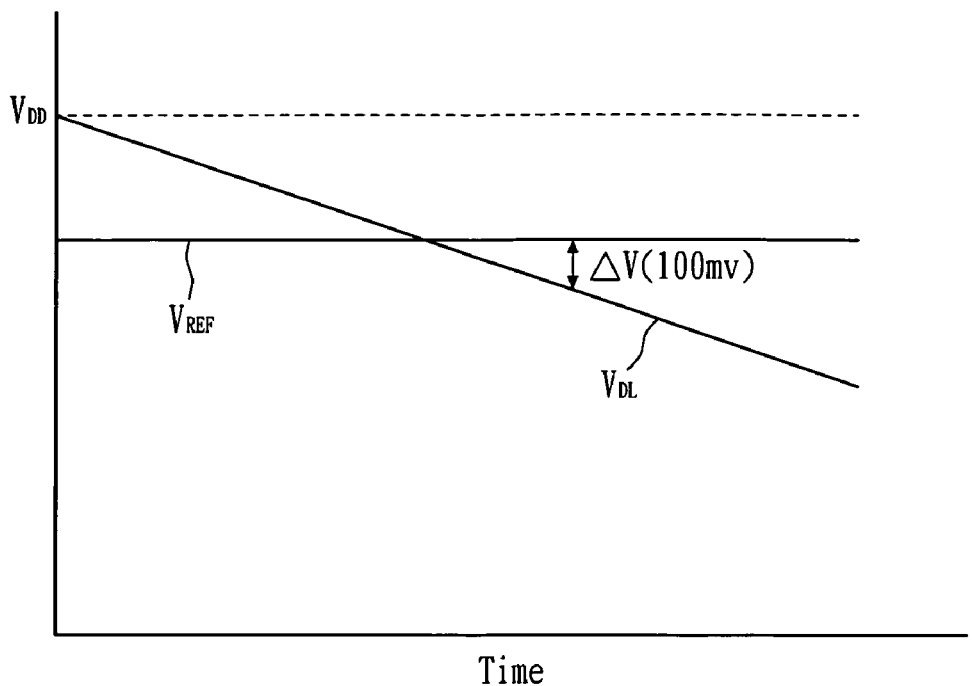
FIG. 1 illustrates a known method for determining the logic state of the input data for a differential sense amplifier.
Figure 4:
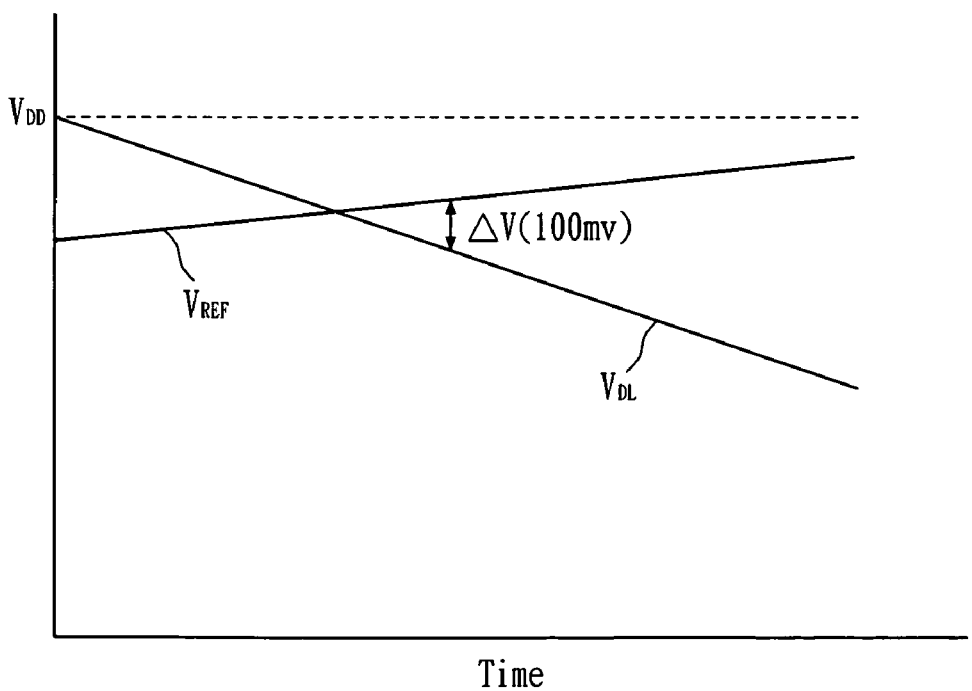
FIG. 4 illustrates the method for determining the logic state of the input data to a differential sense amplifier in accordance with the present invention.

$V_{REF}$ is fixed in FIG. 1, whereas $V_{REF}$ in FIG. 4 increases over time. $V_{DL}$ drops gradually if the stored data is logic "0." Because $V_{REF}$ ramps up in FIG. 4, lines of $V_{DD}$ and $V_{REF}$ intersect earlier in comparison with that shown in FIG. 1. As such, a voltage difference $\Delta V$ between $V_{DL}$ and $V_{REF}$ exceeding a threshold value, e.g., 100 mV, will occur earlier. Accordingly, the sense amplifier with a dynamic reference voltage will invert or activate earlier in comparison with the sense amplifier with a fixed reference voltage, thereby increasing operation efficiency and the sensing margin for reading logic "0."

Figure 5:
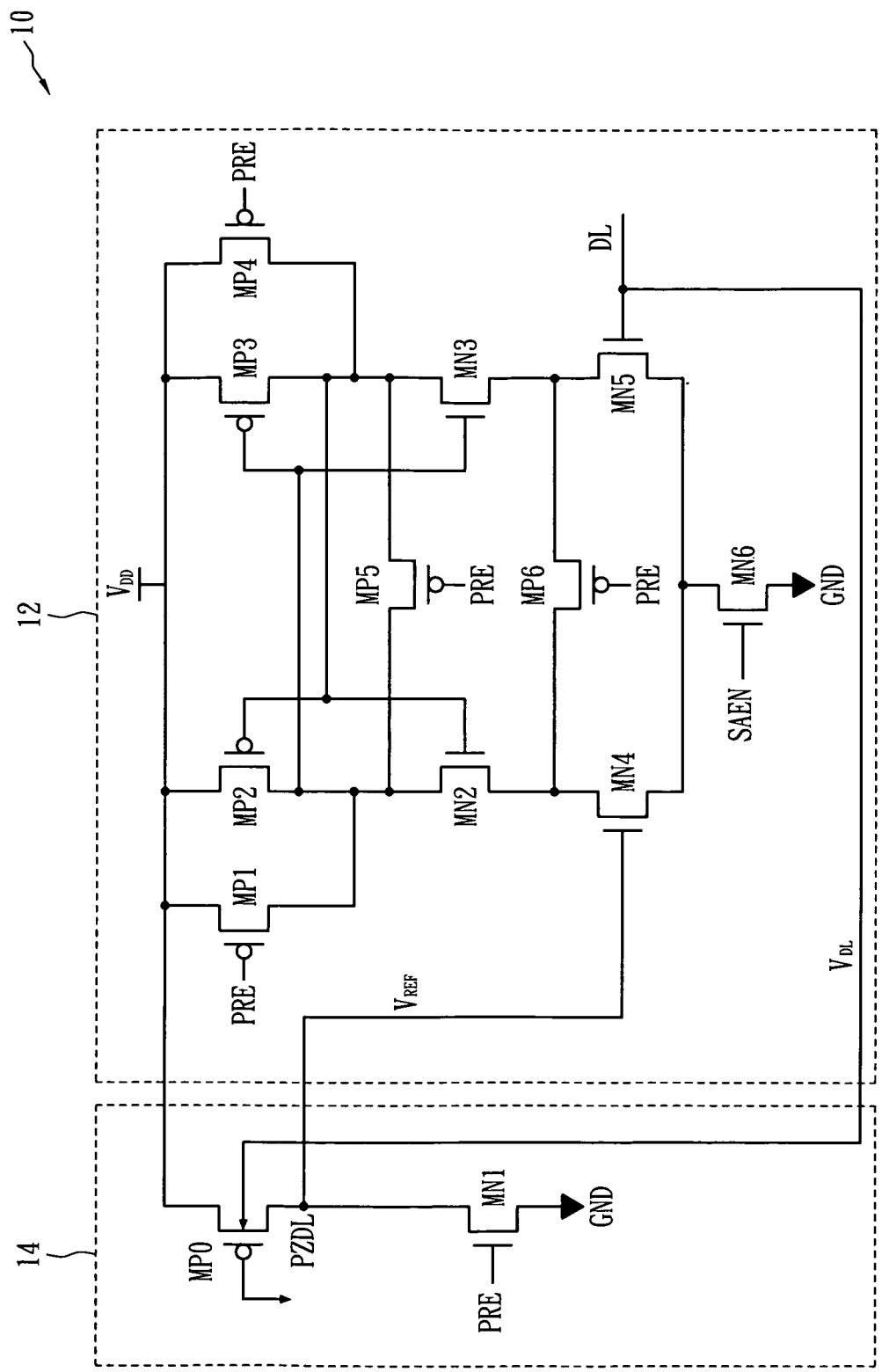
FIGS. 5 and 6 illustrate single-ended differential sense amplifiers in accordance with other embodiments of the present invention.
Figure 6:
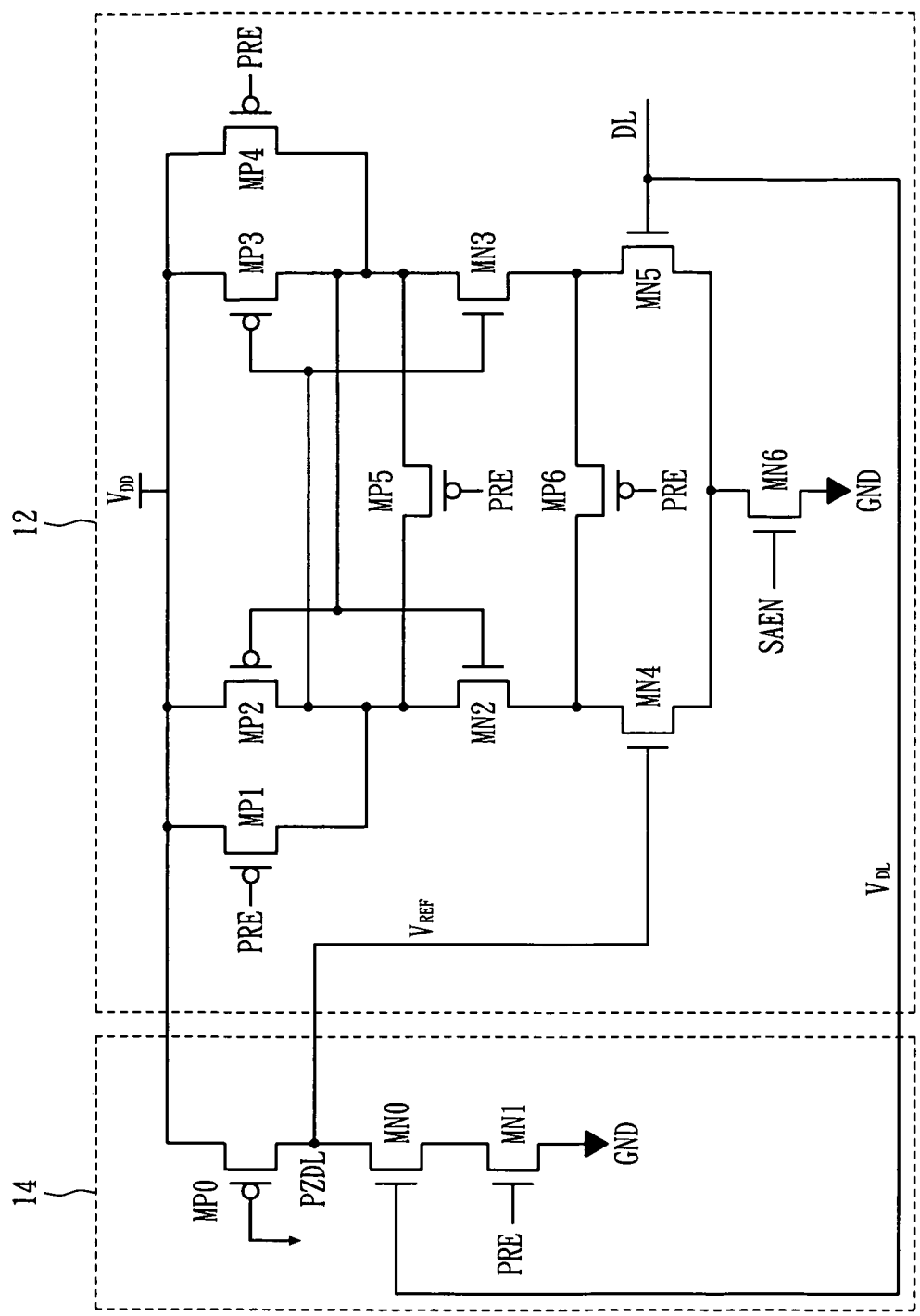

Alternatively, for the dynamic reference voltage generation circuit 14, $V_{DL}$ can be individually applied to either the body of the MP0 or the gate of MN0 as shown in FIG. 5 and FIG. 6, respectively. As such, the dynamic reference voltage generation circuit 14 can also provide the same function.

For the sense amplifier of the present invention, the sensing process can be accelerated with more sensing margin due to dynamic type reference voltage. Also, the sensing time is not sensitive to process variation because the reference voltage tracks the input data line in the memory array and symmetric structure of differential sense amplifier is employed in the present invention.

The above-described embodiments of the present invention are intended to be illustrative only. Numerous alternative embodiments may be devised by those skilled in the art without departing from the scope of the following claims.

What is claimed is:

1. A single-ended differential sense amplifier, comprising:
a differential sense amplifier circuit receiving input data from a data line; and
a dynamic reference voltage generation circuit tracking an input data line voltage of the input data and being coupled to the differential sense amplifier circuit, and generating a dynamic reference voltage based on the input data line voltage to the differential sense amplifier circuit for reading the input data,
wherein the dynamic reference voltage increases and the input data line voltage decreases when reading the input data of a first logic state, and the dynamic reference voltage is constant and the input data line voltage is constant when reading the input data of a second logic state,
wherein the first logic state is logic zero, and the second logic state is logic one.

2. The single-ended differential sense amplifier in accordance with claim 1, wherein the dynamic reference voltage generation circuit comprises a PMOS transistor, a first NMOS transistor and a second NMOS transistor that collectively form a cascade down to ground.

3. The single-ended differential sense amplifier in accordance with claim 2, wherein the dynamic reference voltage is generated at a node between the PMOS transistor and the first NMOS transistor.

4. A single-ended differential sense amplifier, comprising:
a differential sense amplifier circuit receiving input data from a data line; and
a dynamic reference voltage generation circuit tracking an input data line voltage of the input data and being coupled to the differential sense amplifier circuit, and generating a dynamic reference voltage based on the input data line voltage to the differential sense amplifier circuit for reading the input data;
wherein the dynamic reference voltage generation circuit comprises a PMOS transistor, a first NMOS transistor and a second NMOS transistor that collectively form a cascade down to ground; wherein the input data line voltage is applied to the body of the PMOS transistor and the gate of the first NMOS transistor.

5. A single-ended differential sense amplifier, comprising:
a differential sense amplifier circuit receiving input data from a data line; and
a dynamic reference voltage generation circuit tracking an input data line voltage of the input data and being coupled to the differential sense amplifier circuit, and generating a dynamic reference voltage based on the input data line voltage to the differential sense amplifier circuit for reading the input data, wherein the dynamic reference voltage generation circuit comprises a PMOS transistor and a NMOS transistor that collectively form a cascade down to ground, and the input data line voltage is applied to the body of the PMOS transistor.

6. The single-ended differential sense amplifier in accordance with claim 1, wherein the dynamic reference voltage generation circuit comprises a PMOS transistor and a NMOS transistor that collectively form a cascade down to ground, and the input data line voltage is applied to the gate of the NMOS transistor.

7. The single-ended differential sense amplifier in accordance with claim 1,
wherein the differential sense amplifier circuit comprises:
two pre-charge transistors;
a sensing transistor pair; and
a cross-coupled latch coupled to the pre-charge transistors and the sensing transistor pair;
wherein the two pre-charge transistors, the sensing pair transistors and the cross-coupled latch are symmetrical, and the sensing transistor pair is coupled to the dynamic reference voltage generation circuit to receive the dynamic reference voltage.

8. The single-ended differential sense amplifier in accordance with claim 7,
wherein the differential sense amplifier circuit further comprises:
equalizer transistors coupled between the sensing transistor pair and the cross-coupled latch; and
a sensing enable switch coupled between the sensing transistor pair and ground.

9. An operation method for a single-ended differential sense amplifier, comprising the steps of:

providing input data to the single-ended differential sense amplifier;

generating a dynamic reference voltage based on an input data line voltage of the input data, wherein the input data line voltage decreases and the dynamic reference voltage increases when reading the input data of a first logic state and the dynamic reference voltage is constant and the input data line voltage is constant when reading the input data of a second logic state; and activating the single-ended differential sense amplifier when the data line voltage is less than the dynamic reference voltage by a difference that is greater than a threshold value, wherein the first logic state is logic zero and the second logic state is logic one.

10. The operation method for a single-ended differential sense amplifier in accordance with claim 9, wherein the single-ended differential sense amplifier comprises a dynamic reference voltage generation circuit and a differential sense amplifier circuit, the dynamic reference voltage generation circuit receives the input data line voltage for generating the dynamic reference voltage, and the differential sense amplifier circuit compares the dynamic reference voltage and the input data line voltage to determine the logic state of the input data.

* * * * *